United States Patent [19]

Hara

[11] Patent Number: 4,714,980
[45] Date of Patent: Dec. 22, 1987

[54] MEMORY CARD

[75] Inventor: Kazuya Hara, Tokyo, Japan

[73] Assignee: Casio Computer Co., Ltd., Tokyo, Japan

[21] Appl. No.: 909,516

[22] Filed: Sep. 19, 1986

[30] Foreign Application Priority Data

Sep. 24, 1985 [JP] Japan ................................. 60-210815

[51] Int. Cl.⁴ ............................................. H05K 1/14
[52] U.S. Cl. .................................... 361/395; 235/492; 428/929
[58] Field of Search ............... 361/395, 401, 394, 414, 361/410, 398; 174/52 FP, 68.5; 235/488, 490; 340/825.33; 428/929

[56] References Cited

U.S. PATENT DOCUMENTS 4,222,516 9/1980 Badet et al. ........................... 235/492
4,483,067 11/1984 Parmentier ............................. 29/890
4,587,413 5/1986 Hoppe et al. ......................... 235/492
4,617,216 10/1986 Haghiri-Tehrani et al. ....... 428/901

Primary Examiner—A. D. Pellinen
Assistant Examiner—Morris Ginsburg
Attorney, Agent, or Firm—Frishauf, Holtz, Goodman & Woodward

[57] ABSTRACT

An IC module including an integrated circuit chip and external connecting terminals connecting with the leads of the IC chip is accommodated in a cavity of a center sheet. First and second laminated structures, each of which is made of a plurality of sheets, are bonded to one and the other side surfaces of the center sheet. Each one of the first and second laminated structures has the same number of sheets and the same number of adhesive layers. Therefore, contraction and drawing forces produced by a change of environment and applied to the center sheet is counterbalanced, and warpage of the memory card is prevented.

9 Claims, 3 Drawing Figures

4,714,980

MEMORY CARD

BACKGROUND OF THE INVENTION

The present invention relates to a memory card including an IC (Integrated Circuit) chip.

Conventionally known is a memory card with an IC chip therein, which starts to operate in response to an external input signal, compares the input signal with identification information previously stored in the chip, and delivers a comparison result.

Disclosed in U.S. Pat. No. 4,483,067 (by Parmentier) is a method for manufacturing an identification card of a type which is so constructed that a secondary carrier, on which an IC chip is mounted, is provided in a primary carrier, which is formed of a number of sheets of an electrically insulating thermoplastic material.

U.S. Pat. No. 4,222,516 (by Badet et al.) also discloses an identification card which is formed of only a single sheet.

Using the prior art identification cards, the inventor studied on the prevention of breakage of IC chips, and the maintenance of the reliability of electrical conduction of contacts, for external connection. Thereupon, the identification card provided by the method of Parmentier was founded to be preferable to the card by Badet et al.

It was revealed, however, that the former identification card, using a primary carrier formed of a number of laminated sheets, still involves a problem. Namely, the primary carrier is liable to warp, due to changes in ambient temperature or humidity, while an adhesive agent for lamination is being dried, and after the lamination. In other words, the card is prone to warpage.

SUMMARY OF THE INVENTION

The object of the present invention is to provide a memory card, which is manufactured by laminating a plurality of sheets, and cannot warp so much that its performance is affected substantially.

The above object of the present invention is achieved by a memory card comprising: an IC module having a circuit board on which an IC chip and a plurality of external connecting terminals are mounted; a center sheet having a cavity for accommodating the IC module; a first laminated structure formed of a plurality of sheets, each of which has substantially the same plane size as that of the center sheet and laminated each other, and having a plurality of holes for exposing the external connecting terminals of the IC module to the outside, the first laminated structure being bonded to one side surface of the center sheet; and a second laminated structure formed of a plurality of sheets, each of which has substantially the same plane size as that of the center sheet and laminated on each other, and bonded to the other side surface of the center sheet, the sheets of the second laminated structure being the same in number as the sheets of the first laminated structure.

An embodiment of the present invention will now be described with reference to the accompanying drawings.

DETAILED DESCRIPTION OF THE PREFERRED EMBODIMENT

Figure 1:
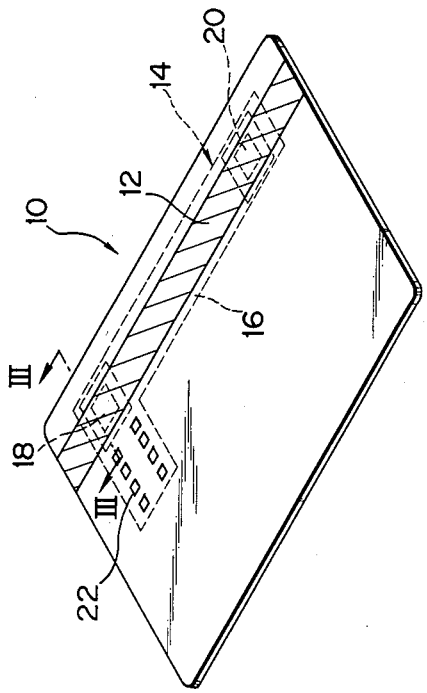
FIG. 1 is a perspective view showing a memory card according to an embodiment of the present invention.

FIG. 1 shows memory card 10 according to an embodiment of the present invention.

Memory card 10 has a rectangular plane configuration, and its dimensions, including the length, width, and thickness, are prescribed by the ISO (International Standardization Organization). Magnetic strip 12 is formed on the upper surface of card 10, so as to extend beside and along one longitudinal edge of the card. Corresponding to strip 12, IC module 14 is contained in card 10. Module 14 includes L-shaped printed-circuit board 16 CPU (central processing unit) chip 18 and memory chip 20, mounted on longitudinal portion 24 of board 16 so as to avoid the central part of portion 24, and a plurality of external terminals 22 on bent portion 26 of board 16. Memory chip 20 is formed, for example, of a nonvolatile EP-ROM (erasable and programmable ROM) or EEP-ROM (electrically erasable and programmable ROM). CPU chip 18 serves to compare a personal identification number, inputted through terminals 22, with personal identification information stored in chip 20, and to deliver the result of the comparison. Here it is to be desired that the information in chip 20 should not be transmitted to terminals 22. Besides the indentification information, personal past records, including credit and transaction data, are stored in chip 20.

Figure 3:
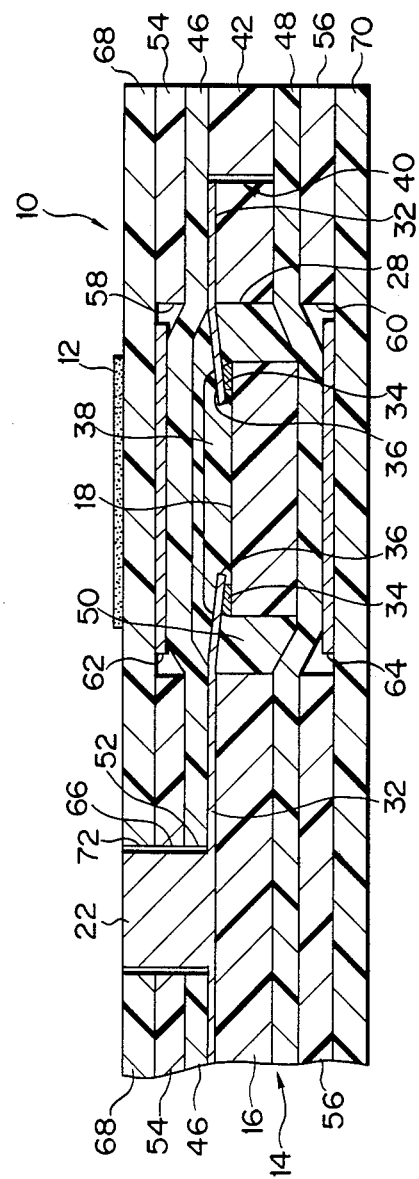
FIG. 3 is an enlarged sectional view of the memory card, as taken along line III—III in FIG. 1.
Figure 2:
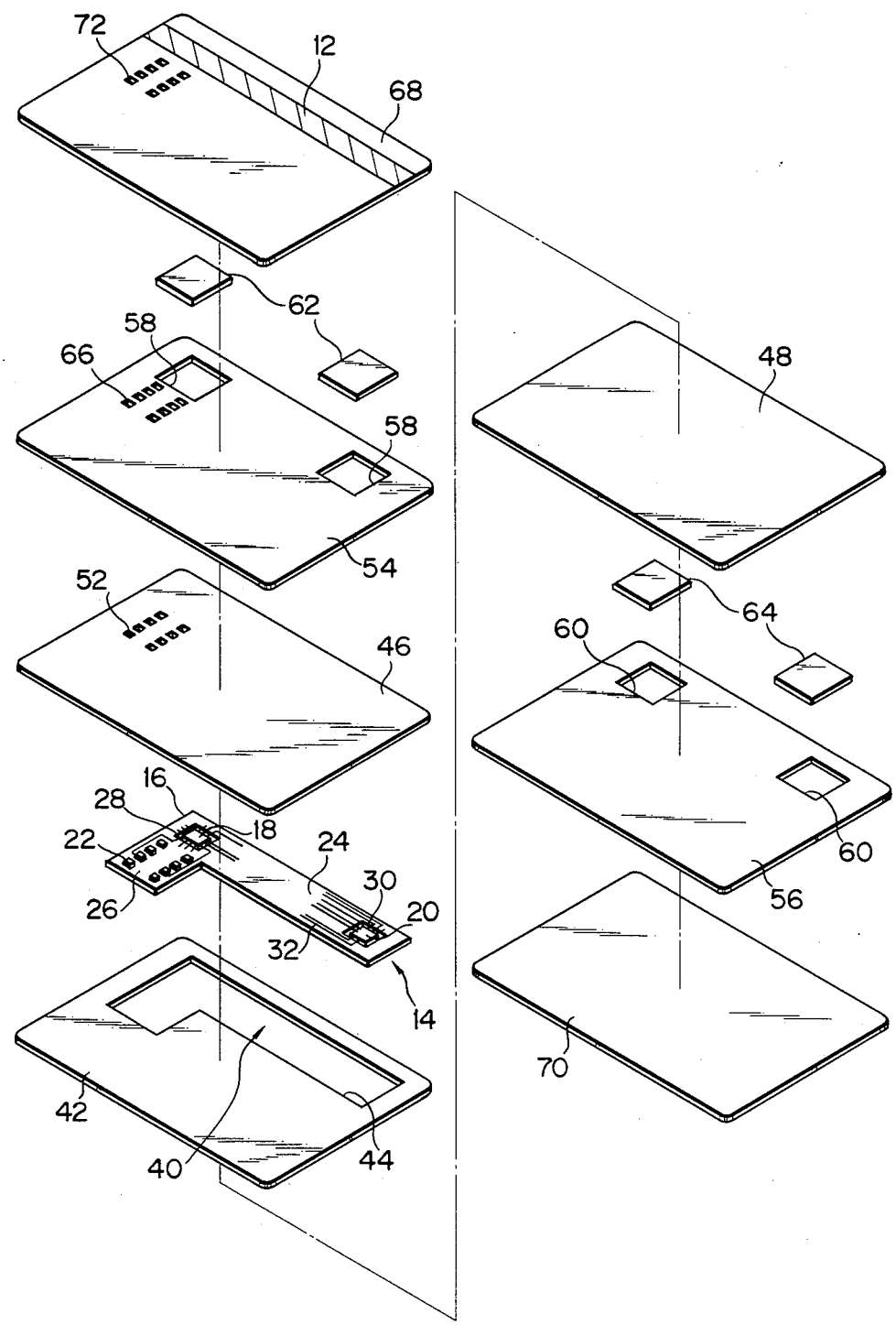
FIG. 2 is an exploded perspective view of the memory card of FIG. 1.

FIG. 2 is an exploded perspective view of memory card 10, and FIG. 3 is an enlarged sectional view taken along line III—III in FIG. 1. As seen from these drawings, card 10 has a seven-layer construction.

L-shaped printed-circuit board 16 of IC module 14 is formed of a flexible, glass-epoxy resin sheet with a thickness of 200 microns. Longitudinal portion 24 of board 16 is a little shorter than the longitudinal edge of memory card 10. The width of portion 24 is greater than the respective transverse dimensions of CPU chip 18 and memory chip 20. Opening 28 for CPU chip 18 is formed in a cross region of board 16, where longitudinal portion 24 crosses bent portion 26, while opening 30 for memory chip 20 is formed near the free end of portion 24. Eight external terminals 22 are arranged, in two equal lines, near the free end of bent portion 26 of board 16. Formed on the upper surface of board 16, moreover, is predetermined lead pattern 32, which electrically connects chips 18 and 20 to terminals 22. Pattern 32 is formed by etching a copper foil which is laminated on insulating board 16. External terminals 22 are formed on pattern 32, by plating with copper, to a predetermined thickness. Joint portions 36 (FIG. 3), between lead pattern 32 and terminals 34 of each of chips 18 and 20, are plated with tin, on their back. In this embodiment, terminals 34 of each chip are each formed of a gold bump on the upper surface of the chip. CPU chip 18 and memory chip 20 are accommodated in openings 28 and 30, respectively, and joint portions 36 of pattern 32 are connected to the corresponding gold-bump terminals 34 of chip 18 and 20. These connections are made by welding gold and tin, by pulse-heating. Connecting portions between gold-bump terminals 34 of CPU chip 18 and joint portions 36 of pattern 32 and connecting portions between gold-bump terminals 34 of memory chip 20 and joint portions 36 of pattern 32 are covered with sealed-resin 38 by molding, so that chips 18 and 20 are fixed to board 16. After the connections are made, the lower portion of each chip projects slightly from the lower surface of board 16, through its corresponding opening 28 or 30, as shown in FIG. 3.

Center sheet 42, having L-shaped opening 40 for IC module 14, is formed of a rigid polyvinyl-chloride sheet with a thickness of approximately 200 microns. Longitudinal portion 44 of opening 40 corresponds to magnetic stripe 12 on the top surface of memory card 10.

First upper and lower sheets 46 and 48, each formed of a soft polyvinyl-chloride sheet with a thickness of 40 microns, are bonded to the upper and lower surfaces, respectively, of center sheet 42, by means of an adhesive agent. As shown in FIG. 3, the respective lower surfaces of CPU chip 18 and memory chip 20 are in contact with the upper surface of lower sheet 48. Between sheets 46 and 48, the inside spaces of openings 28 and 30 for chips 18 and 20 of board 16, are filled with epoxy-resin-based filler 50, e.g., of a two-liquid type, to fix the chips. Eight small apertures 52 in two lines are formed on upper sheet 46, into which external terminals 22 on board 16 are fitted.

Second upper and lower sheets 54 and 56, each formed of a rigid polyvinyl-chloride sheet with a thickness of 100 microns, are bonded to the upper surface of first upper sheet 46 and the lower surface of first lower sheet 48, respectively. Square openings 58 and 60 are formed on sheets 54 and 56, respectively. Openings 58 and 60, which have an area corresponding to that of each chip of IC module 14, are located corresponding to chips 18 and 20, respectively. Square metal pieces 62 and 64 are fitted in their corresponding openings 58 and 60. They serve to protect the chips from external force. Pieces 62 and 64 are formed of stainless steel, and are thinner than second sheets 54 and 56. This difference in thickness, between pieces 62 and 64 and sheets 54 and 56, as shown in FIG. 3, allows the projection of CPU chip 18 and memory chip 20 in the thickness direction, from board 16, and the projection of first sheets 46 and 48, corresponding to the chips. At the same time, the difference prevents metal pieces 62 and 64 from projecting in the thickness direction, from second sheets 54 and 56. Eight small apertures 66 in two lines are also formed on second upper sheet 54, corresponding in position to external terminals 22 on board 16.

Upper and lower outermost films 68 and 70, each formed of a soft polyvinyl chloride film with a thickness of approximately 100 microns, are bonded to the upper surface of second upper sheet 54 and the lower surface of second lower sheet 56, respectively. Eight small apertures 72 in two lines are formed on film 68, corresponding in positions to external terminals 22 on board 16. Magnetic strip 12 is formed by coating fine powder of iron oxide, etc., on the upper surface film 68, along the longitudinal edge of film 68. Strip 12 does not extend on the central portion in the transverse direction.

A method of manufacturing memory card 10, according to the aforementioned embodiment of the present invention, will now be described.

(1) Second lower sheet 56, first lower sheet 48, center sheet 42, first upper sheet 46, second upper sheet 54, and upper outermost film 68 are arranged such ccessively over lower outermost film 70, so as to be spaced vertically. These films and sheets are continuous in their longitudinal directions, respectively, and are stored in the form of a roll, respectively. L-shaped opening 40, openings 60, small apertures 52, and openings 58 and small apertures 66 are previously formed on sheets 42, 56, 46 and 54, respectively.

(2) Lower outermost film 70 is bonded to the lower surface of second lower sheet 56, while metal pieces 64, fitted in their corresponding openings 60 of second lower sheet 56, are bonded to the upper surface of film 70. Likewise, upper outermost film 68 is bonded to the upper surface of second upper sheet 54, while metal pieces 62, fitted in openings 58 of second upper sheet 54, are bonded to the lower surface of film 68.

(3) First lower sheet 48 is bonded to the upper surface of second lower sheet 56, and then, center sheet 42 is bonded to the upper surface of sheet 48.

(4) IC module 14, which is manufactured separately in advance, is fitted into L-shaped opening 40 of center sheet 42 so that the lower surface of module 14 is bonded to the upper surface of first lower sheet 48.

(5) Filler 50 is filled into openings 28 and 30 for chips 18 and 20, in board 16, so as to surround the chips.

(6) First upper sheet 46 is bonded to the upper surface of center sheet 42, which has IC module 14 in its L-shaped opening 40. Then, the lower surface of second upper sheet 54, to which upper outermost film 68 has been bonded, is bonded to the upper surface of sheet 46. Thereupon, the top face of each external terminal 22 of IC module 14 is flush with the upper surface of film 68, as shown in FIG. 3. At the same time, unification of films 68, sheets 54, 46, 42, 48 and 56, and film 70 is completed.

(7) Memory card 10 is cutted for the plane dimensions prescribed by the ISO.

(8) Magnetic strip 12 is formed on the upper surface of upper outermost film 68.

The thickness of adhesive-agent layers, between the films and sheets, is approximately 20 microns. Thus, memory card 10 has an average thickness of about 800 microns, as provided by the ISO.

Memory card 10, according to the above described embodiment of the present invention, is characterized in that an upper laminated structure which includes first and second upper sheets 46 and 54 and upper outermost film 68 and locates on the upper surface side of center sheet 42 having IC module 14 in its L-shaped opening 40, and a lower laminated structure which includes first and second lower sheets 48 and 56 and lower outermost film 70 and locates on the lower surface side of sheet 42, are equivalent in the combined number of films and sheets, and in the number of adhesive-agent layers, and are vertically symmetrical.

Accordingly, the upper and lower laminated structures are equally subject to contraction of the adhesive agent, due to its drying after lamination, and extension or contraction of the films and sheets, attributable to changes of temperature and humidity. Thus, tensile and compressive forces, produced in memory card 10, are well-balanced, so that the card cannot be warped.

Metal pieces 62 and 64, used to protect CPU chip 18 and memory chip 20 contained in memory card 10 from external force, have a plane area much smaller than those of second upper and lower sheets 54 and 56. Therefore, card 10 can have flexibility. If card 10 is flexible, it can be deformed in accordance with the motion of the surface of a user's body, as it is put in a trousers back pocket, for example. Therefore, the pocketed card can reduce its sense of unfitness and the possibility of its injuring the body. As shown in FIG. 3, moreover, the top face of each external terminal 22 of IC module 14 is flush with the upper surface of upper outermost film 68. Accordingly, dust, which may cause a failure in electrical contact, between a probe (not shown) of a terminal apparatus and terminals 22, is prevented from collecting in small apertures 72 of film 68.

It is to be understood that the present invention is not limited to the embodiment described above, and that various changes and modifications may be effected therein by one skilled in the art without departing from the scope or spirit of the invention.

In the embodiment described above, CPU chip 18 and memory chip 20, mounted on board 16, are spaced. Alternatively, however, these chips may be formed into a single unit, which may be disposed in a single position on board 14. In this case, the unified IC chip is preferably located close to external terminals 22. Magnetic strip 12 may be omitted, for the simplicity of manufacturing processes. Since memory card 10 is vertically symmetrical with respect to center sheet 42, it may be manufactured in a manner reverse to the order of procedure described in connection with the above embodiment.

What is claimed is:

1. A memory card comprising:
   a center sheet having a cavity;
   an IC module located in said cavity of said center sheet and including a circuit board on which an IC chip and a plurality of external connecting terminals are mounted;
   a first laminated structure formed of a plurality of sheets, each of which has substantially the same plane size as that of said center sheet and laminated to each other, and having a plurality of holes for exposing said external connecting terminals of said IC module to the outside, said first laminated structure being bonded to one side surface of said center sheet;
   a second laminated structure formed of a plurality of sheets, each of which has substantially the same plane size as that of said center sheet and laminated to each other, said second laminated structure being bonded to the other side surface of said center sheet, the sheets of said second laminated structure being the same in number as the sheets of said first laminated structure, at least one of said first and second laminated structures having an opening at a position corresponding to said IC chip of said IC module located in said cavity of said center sheet, the area of said opening being a little larger than that of asid IC chip; and
   a metal member located in said opening.

2. The memory card according to claim 1, wherein the number of said sheets of each of said first and second laminated structures is three.

3. A memroy card comprising:
   a center sheet having a cavity;
   an IC module located in said cavity of said center sheet, and including a circuit board on which an IC chip and a plurality of external connecting terminals are mounted;
   a first laminated structure formed of a plurality of sheets, each of which has substantially the same plane size as that of said center sheet and which are laminated to each other, and having a plurality of holes for exposing said external connecting terminals of said IC module to the outside, said first laminated structure being bonded to one side surface of said center sheet;
   a second laminated structure formed of a plurality of sheets, each of which has substantially the same plane size as that of said center sheet and which are laminated to each other, said second laminated structure being bonded to the other side surface of said center sheet, the sheets of the second laminated structure being the same in number as the sheets of said first laminated structure; and
   a metal layer having a little larger area than that of said IC chip and mounted in said both first and second laminated structures at portions thereof only corresponding to said IC chip so as to cover one and the other side surfaces of said IC chip of said IC module accommodated in said cavity of said center sheet.

4. The memory card according to claim 3 wherein said IC module includes a further IC chip mounted on said circuit board.

5. The memory card according to claim 4, wherein said two IC chips mounted on said circuit board are located at portions near opposite side edges of said memory card, respectively.

6. A memory card comprising:
   an IC module including a circuit board on which an IC chip and a plurality of external connecting terminals are mounted;
   a laminated inner structure including:
     a center sheet;
     a first set of sheets bonded to one side surface of said center sheet, each of which has substantially the same plane size as that of said center sheet and which are laminated to each other;
     a second set of sheets bonded to the other side surface of said center sheet, each of which has substantially the same plane size as that of said center sheet and which are laminated to each other;
     the sheets of said second set being the same in number as the sheets of said first set;
     a first cavity in which said IC module is located; and
     a second cavity which is formed at a position corresponding to said IC chip of said IC module and which has a little larger area than that of said IC chip;
   a metal layer located in said second cavity so as to cover said IC chip; and
   uppermost and lowermost sheets bonded to one and another side surfaces, respectively, of said laminated inner structure.

7. A memory card according to claim 6, wherein the number of said sheets of said first and second sets is two.

8. A memory card accoding to claim 6, wherein said second cavity is formed in each of said first and second sets of sheets, and said metal layer is located in each of said second cavities of said first and second sets of sheets.

9. A memory card according to claim 6, wherein said first cavity is formed in said center sheet, and one of said first and second sets of sheets has a plurality of through holes formed at a position facing said connecting terminals of said IC module.

* * * * *